US012219285B2

(12) United States Patent
Yin et al.

(10) Patent No.: US 12,219,285 B2
(45) Date of Patent: Feb. 4, 2025

(54) CHIP WITH AUTOMATIC CLOCK SIGNAL CORRECTION AND AUTOMATIC CORRECTION METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Jai-Jyun Shen, New Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 73 days.

(21) Appl. No.: 18/306,255

(22) Filed: Apr. 25, 2023

(65) Prior Publication Data

US 2023/0370073 A1    Nov. 16, 2023

Related U.S. Application Data

(60) Provisional application No. 63/341,423, filed on May 13, 2022.

(51) Int. Cl.
*H04N 25/78* (2023.01)
*G06F 1/08* (2006.01)
(Continued)

(52) U.S. Cl.
CPC .............. *H04N 25/78* (2023.01); *G06F 1/08* (2013.01); *H01L 25/0753* (2013.01); *H01L 25/18* (2013.01); *H01L 27/14612* (2013.01); *H01L 27/14632* (2013.01); *H01L 27/14636* (2013.01); *H03K 19/018521* (2013.01);
(Continued)

(58) Field of Classification Search
CPC ...... H04N 25/78; H04N 25/60; H04N 25/627; H04N 25/63; H04N 25/709; H04N 25/77; H04N 25/772; H04N 25/778; H04N 25/7795; H04N 25/779; G06F 1/08; H01L 25/0753; H01L 25/18; H01L 27/14612; H01L 27/14632; H01L 27/14636;
(Continued)

(56) References Cited

U.S. PATENT DOCUMENTS

2004/0090273 A1* 5/2004 Chang ................. H03L 7/085
331/16
2022/0224804 A1* 7/2022 Wang ................ H03L 7/0995

* cited by examiner

*Primary Examiner* — Richard Tan
(74) *Attorney, Agent, or Firm* — JCIPRNET (57) ABSTRACT

Disclosed are a chip with automatic clock signal correction and an automatic correction method. The chip includes a transmission interface, an oscillator and a correction logic circuit. The transmission interface provides a first clock signal. The oscillator generates a second clock signal. The correction logic circuit is coupled to the oscillator and the transmission interface, and performs correction operation to count the first clock signal to generate a first clock count value, and count the second clock signal to generate a second clock count value. When the first clock count value is equal to the first count target value, the correction logic circuit stops counting, and calculates a correction value based on the second clock count value and the second count target value. The correction logic circuit outputs the correction value to the oscillator, and the oscillator corrects a frequency of the second clock signal according to the correction value.

18 Claims, 6 Drawing Sheets

(51) Int. Cl.
*H01L 25/075* (2006.01)
*H01L 25/18* (2023.01)
*H01L 27/146* (2006.01)
*H03K 19/0185* (2006.01)
*H03L 7/099* (2006.01)
*H04N 25/60* (2023.01)
*H04N 25/627* (2023.01)
*H04N 25/63* (2023.01)
*H04N 25/709* (2023.01)
*H04N 25/76* (2023.01)
*H04N 25/77* (2023.01)
*H04N 25/772* (2023.01)
*H04N 25/778* (2023.01)

(52) U.S. Cl.
CPC .............. *H03L 7/099* (2013.01); *H04N 25/60* (2023.01); *H04N 25/627* (2023.01); *H04N 25/63* (2023.01); *H04N 25/709* (2023.01); *H04N 25/77* (2023.01); *H04N 25/772* (2023.01); *H04N 25/778* (2023.01); *H04N 25/7795* (2023.01)

(58) Field of Classification Search
CPC .. H03K 19/018521; H03K 5/01; H03L 7/099; H03L 7/0992
USPC ........................................................ 331/1 R
See application file for complete search history.

CHIP WITH AUTOMATIC CLOCK SIGNAL CORRECTION AND AUTOMATIC CORRECTION METHOD

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

The present disclosure relates to a chip, and in particular to a chip with automatic clock signal correction and an automatic correction method.

Description of Related Art

Generally speaking, the oscillator in the chip is configured to provide the operating clock needed for the related operations inside the chip. However, when a frequency error occurs in the clock signal generated by the oscillator in the chip, the error is likely to cause errors or failures in the operation of the chip. Specifically, if the clock signal provided by the oscillator in the image sensor chip generates a frequency error, the error will dramatically affect the image sensing results output by the image sensor chip, resulting in failure of the image sensor chip or content error. Although the conventional solution adopts the oscillator of the Phase Locked Loop (PLL) circuit to generate a clock signal with a minor frequency error, it is required to add an additional transmission interface specifically for PLL, and therefore the complexity of chip design, manufacturing cost and chip size are all increased as well.

SUMMARY

The present disclosure provides a chip with automatic clock signal correction and an automatic correction method, which are able to automatically correct the frequency of the clock signal generated by the oscillator.

In the disclosure, the chip with automatic clock signal correction includes a transmission interface, an oscillator and a correction logic circuit. The transmission interface provides a first clock signal. The first clock signal is a discontinuous clock signal. The oscillator generates a second clock signal. The correction logic circuit is coupled to the oscillator and the transmission interface, and performs correction operation to count the first clock signal to generate a first clock count value, and count the second clock signal to generate a second clock count value. When the first clock count value is equal to the first count target value, the correction logic circuit stops counting, and calculates a correction value based on the second clock count value and the second count target value. The correction logic circuit outputs the correction value to the oscillator, and the oscillator corrects a frequency of the second clock signal according to the correction value.

The automatic correction method of the clock signal of the present disclosure includes the steps: providing a first clock signal through a transmission interface, the first clock signal is a discontinuous clock signal; generating a second clock signal by an oscillator; performing a correction operation by a correction logic circuit to count the first clock signal to generate a first clock count value, and count the second clock signal to generate a second clock count value; and when the first clock count value is equal to the first count target value, stopping counting through the correction logic circuit; calculating a correction value by the correction logic circuit according to the second clock count value and the second count target value; outputting the correction value to the oscillator by the correction logic circuit; and correcting the frequency of the second clock signal by the oscillator according to the correction value.

Based on the above, the chip with automatic clock signal correction and the automatic correction method of the present disclosure are able to correct the frequency of the second clock signal generated by the oscillator according to the first clock signal provided by the transmission interface.

In order to make the above-mentioned features and advantages of the present disclosure more comprehensible, the following specific embodiments are described in detail in conjunction with the accompanying drawings.

DESCRIPTION OF THE EMBODIMENTS

In order to make the content of the present disclosure more comprehensible, the following specific examples are used as examples in which the present disclosure can indeed be implemented. In addition, wherever possible, elements/components/steps adopting the same reference numerals in the drawings and embodiments represent the same or similar parts.

Figure 1:
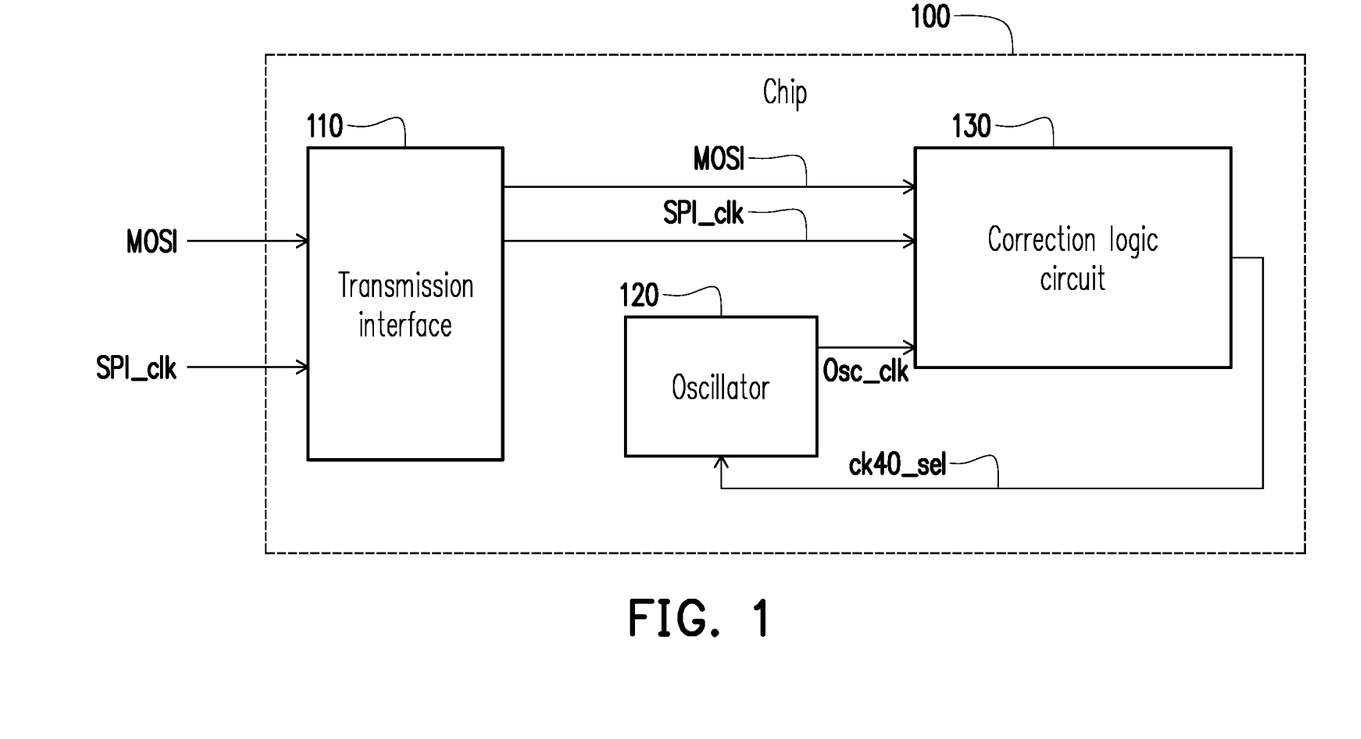
FIG. 1 is a schematic circuit diagram of a chip with automatic clock signal correction according to an embodiment of the present disclosure.

FIG. 1 is a schematic circuit diagram of a chip with automatic clock signal correction according to an embodiment of the present disclosure. Referring to FIG. 1, the chip 100 includes a transmission interface 110, an oscillator 120, and a correction logic circuit 130. The oscillator 120 is coupled to the transmission interface 110 and the correction logic circuit 130. In this embodiment, the transmission interface 110 may receive a master-output slave-input signal MOSI and a first clock signal SPI_clk from an external circuit (e.g., an external control circuit), and provide them to the correction logic circuit 130. The transmission interface 110 may further receive other signals from an external control circuit, such as an inter-integrated circuit, and not limited to that shown in FIG. 1.

In this embodiment, the first clock signal SPI_clk provided by the transmission interface 110 may be a discontinuous clock signal. Moreover, the first clock signal SPI_clk is toggled only when the command is transmitted. In this regard, the clock signal will stop toggling during the gap between transmissions of two commands. On the other hand, the first clock signal provided by the transmission interface 110 may also be a continuous clock signal. For example, the clock signal is a continuous clock signal only when burst write or burst read is performed. Furthermore, the first clock signal provided by the transmission interface 110 may include a discontinuous clock signal and a continuous clock signal, and may also have a continuous fixed frequency/period, or a predictable short interruption time.

In this embodiment, the oscillator 120 may output the second clock signal Osc_clk to the correction logic circuit 130. The correction logic circuit 130 may generate the clock generation setting CK40_sel according to the first clock signal SPI_clk and the second clock signal Osc_clk, and the signal content of the clock generation setting CK40_sel is the correction value CV, so that the oscillator 120 may correct the frequency of the second clock signal Osc_clk based on the correction value CV.

In this embodiment, the transmission interface 110 may be configured to transmit the signal provided by the external control circuit to the correction logic circuit 130 inside the chip 100, and the external control circuit may be, for example, a serial peripheral interface (SPI) circuit or inter-integrated circuit (I2C) or improved inter integrated circuit (I3C), etc., and the first clock signal SPI_clk may be a SPI signal. In this embodiment, the first clock signal SPI_clk is provided by an external control circuit (such as an external master control circuit). The correction logic circuit 130 of the chip 100 may use the frequency of the first clock signal SPI_clk provided by the transmission interface 110 as a judgment reference to accurately correct the frequency of the second clock signal Osc_clk. In an embodiment, the correction logic circuit 130 may recursively correct the frequency of the second clock signal Osc_clk, so that the frequency of the second clock signal Osc_clk may be gradually corrected to (approximated to) the correct frequency.

Figure 2:
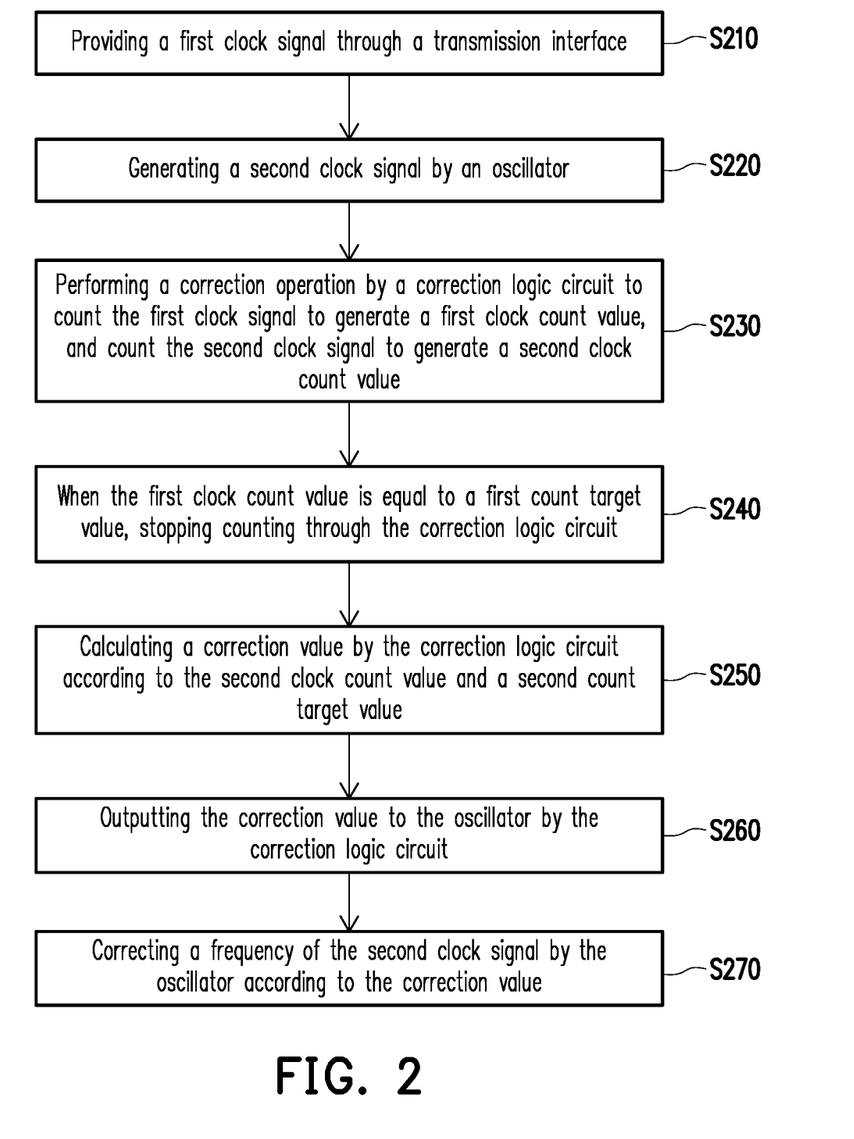
FIG. 2 is a flowchart of an automatic correction method for a clock signal according to an embodiment of the present disclosure.

FIG. 2 is a flowchart of an automatic correction method for a clock signal according to an embodiment of the present disclosure. Referring to FIG. 1 and FIG. 2, the chip 100 may perform the following steps S210 to S270 to realize the automatic correction function for the clock signal. In step S210, the chip 100 may provide the first clock signal SPI_clk through the transmission interface 110. In this embodiment, the transmission interface 110 may receive the master-output slave-input signal MOSI and the first clock signal SPI_clk from the external control circuit, and provide the master-output slave-input signal MOSI and the first clock signal SPI_clk to the correction logic circuit 130.

Figure 3:
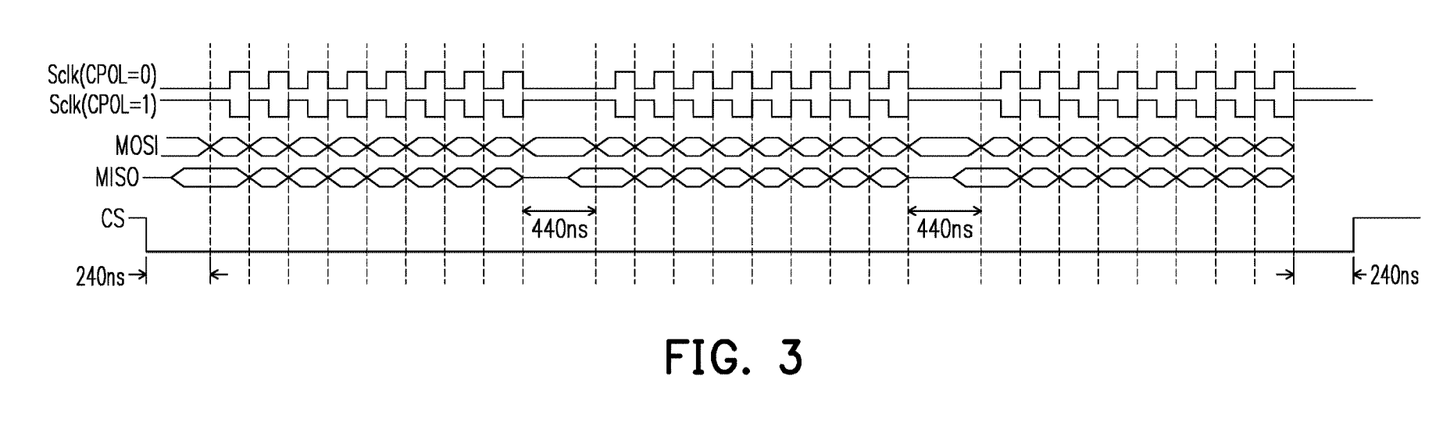
FIG. 3 is a schematic diagram of a plurality of signals transmitted between a transmission interface and an external circuit according to an embodiment of the present disclosure.

With reference to FIG. 3, FIG. 3 is a schematic diagram of a plurality of signals transmitted between a transmission interface and an external circuit according to an embodiment of the present disclosure. The first clock signal SPI_clk of the present disclosure may be an SPI clock signal. The chip 100 may communicate with the external control circuit through the transmission interface 110, and perform data transmission based on the SPI transfer protocol. The external control circuit may be synchronized with the transmission interface 110 through the serial clock Sclk (CPOL=0 or CPOL=1) whose clock polarity is 0 or 1. During the period when the chip 100 is selected (that is, the period when the chip selection signal CS received by the transmission interface 110 is at a low voltage level), the external control circuit and the transmission interface 110 may exchange (transmit) data according to the timing of the master-output slave-input signal MOSI and the master-input slave-output signal MISO (transmitted sequentially from the most significant bit (MSB) to the least significant bit (LSB)). 24-bit data may be transmitted between the external control circuit and the transmission interface 110, and there may be, for example, a time interval of 240 nanoseconds (240 ns) between the start and end of the data transmission. There may be a time interval of 440 ns between the data transmission period of the 8th bit and the 9th bit and the data transmission period of the 16th bit and the 17th bit.

In this embodiment, the fact that the first clock signal SPI_clk provided by the transmission interface 110 is a discontinuous signal means that the first clock signal SPI_clk is a discontinuous signal as a whole, and the first clock signal SPI_clk will be corrected by utilizing the continuous signal period therein. On the other hand, the continuous signal period may be multiple continuous signals, that is, including discontinuous signals (including the gaps of predictable discontinuous signals, such as 440 ns in FIG. 3, and the actual length of time may be determined according to the transmission interface agreement), and then inferred by an algorithm to calculate an equivalent frequency.

In step S220, the oscillator 120 may generate a second clock signal Osc_clk to the correction logic circuit 130. In this embodiment, the second clock signal Osc_clk generated by the oscillator 120 may be utilized to provide the operating frequency used by other internal circuits of the chip 100. In an embodiment, the chip 100 may be an image sensor chip, but the disclosure is not limited thereto. In step S230, the chip 100 may perform a correction operation by the correction logic circuit 130 to count the first clock signal SPI_clk to generate a first clock count value, and count the second clock signal Osc_clk to generate a second clock count value.

In step S240, when the first clock count value is equal to the first count target value (or clock target value), the correction logic circuit 130 stops counting. In this embodiment, the correction logic circuit 130 may stop counting the first clock signal SPI_clk and the second clock signal Osc_clk, and temporarily store the first clock count value and the second clock count value in the register of the correction logic circuit 130.

In step S250, the correction logic circuit 130 may calculate a correction value according to the second clock count value and the second count target value (or clock target value). In step S260, the correction logic circuit 130 may output the correction value CV to the oscillator 120. In step S270, the oscillator 120 may correct the frequency of the second clock signal Osc_clk according to the correction value CV. In this embodiment, the correction logic circuit 130 may add up the correction value CV and the first encode value (that is, the digital code generated by combining 0 or 1) corresponding to the second clock signal to generate the second encode value (the digital code after correction), and the oscillator 120 may generate a new second clock signal Osc_clk according to the second encode value. In other words, the oscillator 120 may first determine the frequency of the second clock signal Osc_clk according to the first encode value, then the oscillator 120 may first determine the frequency of the second clock signal Osc_clk according to the second encode value generated after correction. In this way, the frequency of the second clock signal Osc_clk may be effectively corrected to (or approximated to) the desired frequency.

Figure 4:
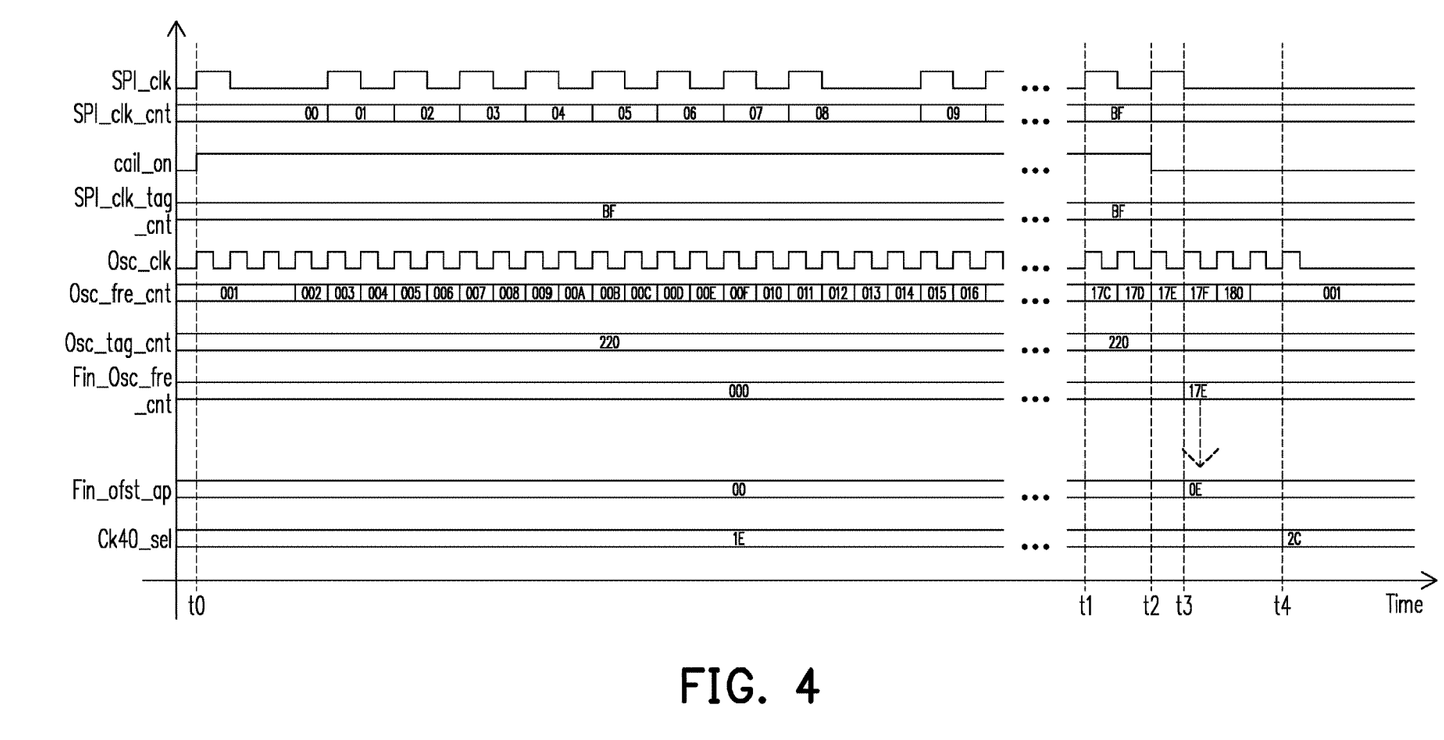
FIG. 4 is a schematic diagram of a clock signal and a count value according to an embodiment of the present disclosure.
Figure 5:
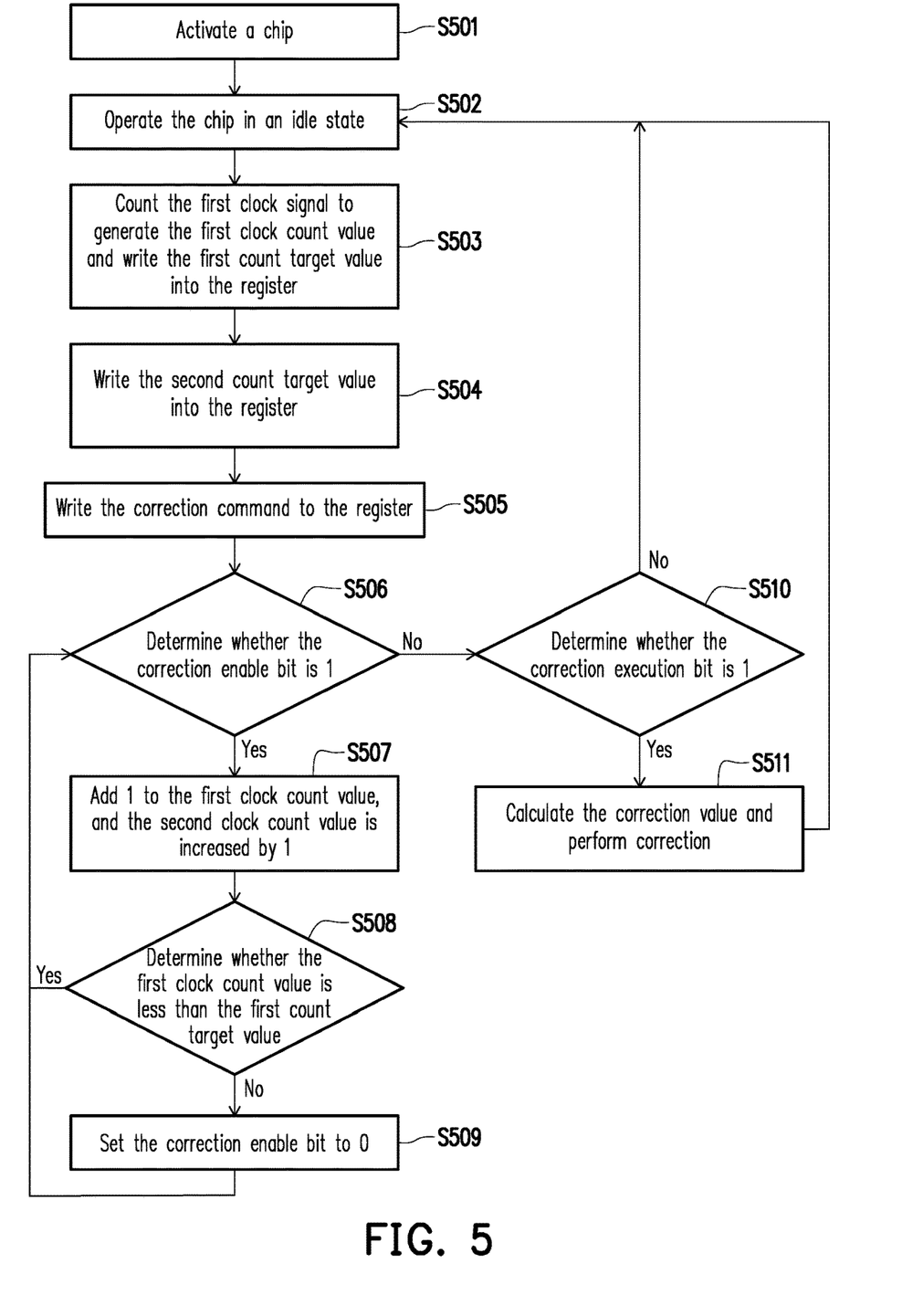
FIG. 5 is a flowchart of an automatic correction method for a clock signal according to an embodiment of the present disclosure.

FIG. 4 is a schematic diagram of a clock signal and a count value according to an embodiment of the present disclosure. FIG. 5 is a flowchart of an automatic correction method for a clock signal according to an embodiment of the present disclosure. Referring to FIG. 1, FIG. 4, and FIG. 5, this embodiment further specifically describes the recursive correction process of the second clock signal Osc_clk. The chip 100 may perform the following steps S501 to S511 to realize the automatic correction function of the clock signal. In step S501, the chip 100 is activated. In this embodiment, the external control circuit may control and activate the chip 100 through the master-output slave-input signal MOSI. In step S502, the chip 100 may be operated in an idle state. In step S503, the chip 100 may count the first clock signal SPI_clk to generate a first clock count value SPI_clk_cnt, and write the first count target value SPI_clk_tag_cnt into the register in the correction logic circuit 130. In step S504, the second count target value Osc_tag_cnt is written into the register in the correction logic circuit 130.

Referring to FIG. 4, in this embodiment, the first encode value is the encode value "1E" of the clock generation setting Ck40_sel before time t4. The second encode value is the encode value "2C" of the clock generation setting Ck40_sel after time t4. The first encode value and the correction value CV are added up to generate a second encode value. The oscillator 120 may generate a new second clock signal Osc_clk according to the second encode value.

In step S505, the external control circuit may control the chip 100 to start the correction operation through the master-output slave-input signal MOSI, the chip selection signal CS and the first clock signal SPI_clk, so that the correction logic circuit 130 may write the correction command to the register of the correction logic circuit 130. As shown in FIG. 4, after the external control circuit starts the correction operation, the correction enable bit cali_on may be 1 (indicated by a high voltage level) during the period from time t0 to time t2. Moreover, the correction execution bit recorded in the register of the correction logic circuit 130 may be set to 1, so that the correction logic circuit 130 may perform correction operation.

In step S506, the correction logic circuit 130 determines whether the correction enable bit cali_on is 1. During the period from the time t0 to the time t2, the correction enable bit cali_on is 1, and the correction logic circuit 130 may execute step S507. In step S507, when the correction logic circuit 130 detects the rising edge of the first clock signal SPI_clk, the correction logic circuit 130 may add 1 to the first clock count value SPI_clk_cnt, and when the correction logic circuit 130 detects the rising edge of the second clock signal Osc_clk, the second clock count value Osc_fre_cnt is increased by 1. The correction logic circuit 130 may count the first clock signal SPI_clk to generate the first clock count value SPI_clk_cnt, and write the first clock count value SPI_clk_cnt into the register of the correction logic circuit 130. Moreover, the correction logic circuit 130 may count the second clock signal Osc_clk to generate the second clock count value, and write the second clock count value Osc_fre_cnt into the register of the correction logic circuit 130. As shown in FIG. 4, the correction logic circuit 130 may respectively add 1 to the first clock count value SPI_clk_cnt and the second clock count value Osc_fre_cnt when the signal waveforms of the first clock signal SPI_clk and the second clock signal Osc_clk have rising edges, thereby counting the frequencies of the first clock signal SPI_clk and the second clock signal Osc_clk.

In step S508, the correction logic circuit 130 may determine whether the first clock count value SPI_clk_cnt is less than the first count target value SPI_clk_tag_cnt. If yes (from time t0 to time t1), the correction logic circuit 130 may re-execute step S506 and step S507. If not (from time t1 to time t2), the correction logic circuit 130 may set the correction enable bit cali_on to 0 (the correction enable bit cali_on is modified to 0 at the time of the next rising edge of the first clock signal SPI_clk (indicated by a low voltage level)). Moreover, in step S506, the correction logic circuit 130 determines that the correction enable bit cali_on is not 1, so the correction logic circuit 130 executes step S510 to further determine whether the correction execution bit is 1. If not, the correction logic circuit 130 re-executes step S502. If yes, the correction logic circuit 130 executes step S511 to calculate the correction value CV and perform correction.

In this embodiment, at time t2, the correction enable bit cali_on is 0, and the correction logic circuit 130 may stop counting the second clock count value Osc_fre_cnt, and the correction logic circuit 130 may store the counting result of the current second clock count value Osc_fre_cnt to the final count value Fin_Osc_fre_cnt (such as "17E") at time t3. In this embodiment, the chip 100 may further include a one-time programmable (OTP) memory, and the OTP memory is coupled to the correction logic circuit 130. The OTP memory may be used to store the correction value CV. The correction logic circuit 130 may store the final error execution value Fin_ofst_ap into a storage bit of the OTP memory, and use the final error execution value Fin_ofst_ap when calculating the clock generation setting Ck40_sel. Then, when the chip 100 is started, the correction logic circuit 130 will read the final error execution signal in the OTP memory (that is, read the final error execution value Fin_ofst_ap) into the register of the correction logic circuit 130. Moreover, at time t4, the correction logic circuit 130 may read the register to provide the correction value CV to the oscillator 120, so that the oscillator 120 may correct the second clock signal Osc_clk according to the correction value CV.

In this embodiment, the correction logic circuit 130 may subtract the second count target value Osc_tag_cnt from the second clock count value Osc_fre_cnt (i.e., the final count value Fin_Osc_fre_cnt) to obtain the correction value CV. Alternatively, the correction logic circuit 130 may subtract the second count target value Osc_tag_cnt from the second clock count value Osc_fre_cnt (i.e., the final count value Fin_Osc_fre_cnt) to obtain the first value, and divide the first value by a multiple value (for example, 1.4) to obtain the correction value CV. Alternatively, the correction logic circuit 130 may subtract the second count target value Osc_tag_cnt from the second clock count value Osc_fre_cnt (i.e., the final count value Fin_Osc_fre_cnt) to obtain the first value, and divide the first value by a multiple value (for example, 1.4) and by an offset coefficient (for example, 8) to obtain the correction value CV close to the frequency target Ft. In this embodiment, the correction logic circuit 130 adds up the correction value CV and the first encode value corresponding to the second clock signal Osc_clk to generate the second encode value, and the oscillator 120 may generate the new second clock signal Osc_clk according to the second encode value. For example, the encode value "1E" of the clock generation setting Ck40_sel recorded by the oscillator 120 is updated to "2C". In this way, the second clock signal Osc_clk may be corrected to a desired frequency. Moreover, when the chip 100 is started up next time, the correction logic circuit 130 may read the OTP memory, and provide the correction value CV to the oscillator 120, so that the oscillator 120 may correct the second clock signal Osc_clk according to the correction value CV to maintain the accuracy of the frequency of the second clock signal Osc_clk.

Figure 6:
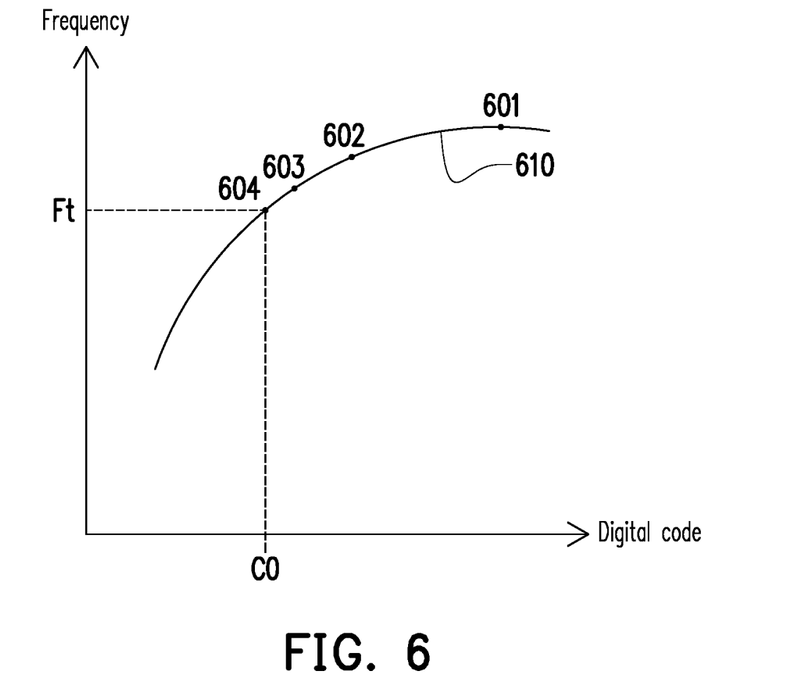
FIG. 6 is a schematic diagram of correcting the frequency of the second clock signal according to an embodiment of the present disclosure.
Figure 7:
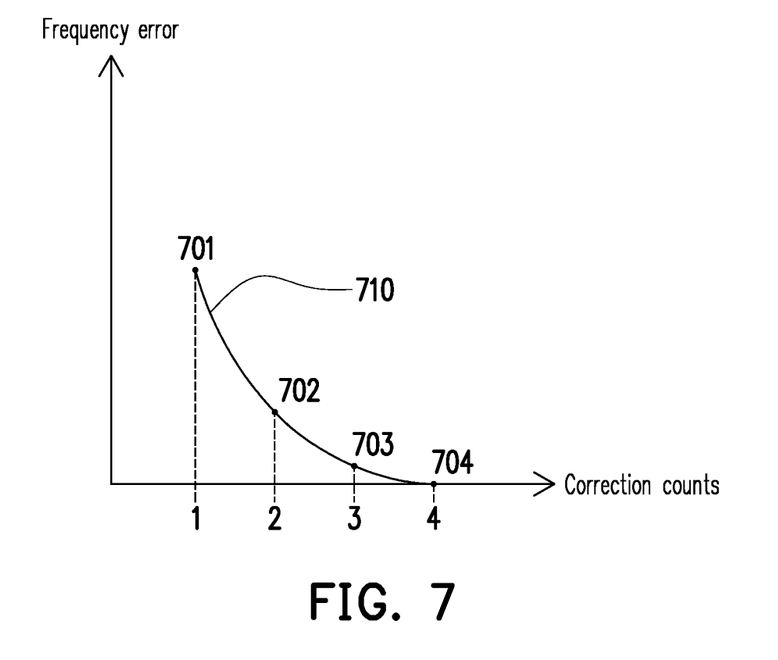
FIG. 7 is a schematic diagram showing changes in the frequency error of the second clock signal according to an embodiment of the present disclosure.

In this embodiment, the correction logic circuit 130 re-executes step S502, so that after the OTP memory is read, the correction logic circuit 130 may perform the correction operation again. After the correction logic circuit 130 reads the OTP memory, the correction logic circuit 130 provides the correction value CV to the oscillator 120, so that the oscillator 120 corrects the second clock signal Osc_clk according to the correction value CV. With the recursive execution logic shown in FIG. 5, the correction logic circuit 130 may perform multiple correction operations. Moreover, the frequency of the second clock signal Osc_clk sequentially corrected by the correction logic circuit 130 may be approximated to the frequency target Ft successively. That is, the plurality of count values obtained in these correction operations may be approximated to the second count target value Osc_tag_cnt successively. As shown in FIG. 6, FIG. 6 is a schematic diagram of correcting the frequency of the second clock signal according to an embodiment of the present disclosure. In this regard, the correction logic circuit 130 may perform multiple correction operations (points 601-604 on the digital code versus frequency curve 610 shown in FIG. 6), and the multiple count values of the second clock signal Osc_clk obtained in these correction operations may be successively approximated to the second count target value Osc_tag_cnt. That is, the successively updated frequency and code of the second clock signal Osc_clk denoted by points 601-604 may be successively approximated to Ft (frequency target) corresponding to the second count target value Osc_tag_cnt and corresponding CV correction value thereof as denoted by CO in FIG. 6. The relationship curve 610 between code and frequency is non-linear, so values of CO and Ft are not proportional in the correction process. The present disclosure may use multiple times of approximations to approximate the frequency of the second clock signal to the frequency target Ft, and is not limited to the straight relationship curve between code and frequency, that is to say, the present disclosure is applicable to curves. In this way, as shown in FIG. 7, FIG. 7 is a schematic diagram of correcting the frequency of the second clock signal according to an embodiment of the present disclosure. FIG. 7 shows points 701 to 704 on the error curve 710 between correction counts and frequency, the points 701 to 704 may correspond to the frequency correction results of the points 601 to 604. That is, the frequency error between the successively updated frequency of the second clock signal Osc_clk denoted by points 601-604 and the frequency target Ft corresponding to the second count target value Osc_tag_cnt may be gradually reduced as the number of corrections increases. In addition, if it is desired to change the frequency of the second clock signal Osc_clk again, it is possible to write a new second clock target value again, and perform the correction operation as shown in FIG. 5 again to make the frequency of the second clock signal Osc_clk to approximate to the new frequency target Ft successively.

It should be noted that in this embodiment, the correction logic circuit 130 counts the number of rising edges of the first clock signal SPI_clk to count the second clock signal Osc_clk, thereby correcting the second clock signal Osc_clk. That is, when the number of rising edges of the first clock signal SPI_clk is equal to the preset first count target value, the counting of the second clock signal Osc_clk is stopped, and a correction value CV is generated according to the last count value Fin_Osc_fre_cnt of the second clock signal Osc_clk.

To sum up, the chip with automatic clock signal correction and the automatic correction method of the present disclosure may utilize the frequency of the external clock signal provided by the transmission interface as a criterion for making judgment without requiring additional continuous clock signals, thereby automatically determining whether there is a frequency error between the frequency of the clock signal generated by the oscillator and the frequency target, and gradually adjusting the frequency of the clock signal generated by the oscillator to be approximated to the desired frequency target through recursive correction.

What is claimed is:

1. A chip with automatic clock signal correction, comprising:
   a transmission interface, configured to provide a first clock signal, wherein the first clock signal is a discontinuous clock signal;
   an oscillator, configured to generate a second clock signal; and
   a correction logic circuit, coupled to the oscillator and the transmission interface, and performing a correction operation to count the first clock signal to generate a first clock count value, and count the second clock signal to generate a second clock count value;
   wherein when the first clock count value is equal to a first count target value, the correction logic circuit stops counting, and calculates a correction value based on the second clock count value and a second count target value;
   wherein the correction logic circuit outputs the correction value to the oscillator, and the oscillator corrects a frequency of the second clock signal according to the correction value,
   wherein the correction logic circuit subtracts the second count target value from the second clock count value to obtain a first value, and divides the first value by a multiple value and by an offset coefficient to obtain the correction value.

2. The chip according to claim 1, wherein the correction logic circuit adds up the correction value and a first encode value corresponding to the second clock signal to generate a second encode value, and the oscillator generates a new second clock signal according to the second encode value.

3. The chip according to claim 1, wherein the transmission interface is a serial peripheral interface (SPI), and the first clock signal is a SPI clock signal.

4. The chip according to claim 1, wherein the transmission interface is an integrated bus circuit.

5. The chip according to claim 1, wherein the transmission interface is an improved internal integrated circuit.

6. The chip according to claim 1, wherein a relationship curve between digital code and frequency is generated according to a corresponding relationship between the second clock signal and the correction value.

7. The chip according to claim 6, wherein the second clock signal is approximated to a frequency target through several times of the correction operation.

8. The chip according to claim 1, wherein the correction logic circuit counts the first clock signal and the second clock signal simultaneously.

9. The chip according to claim 1, further comprising:
   a one-time programmable (OTP) memory, which is coupled to the correction logic circuit, and configured to store the correction value, wherein when the chip is started up next time, the correction logic circuit reads the OTP memory and provides the correction value to the oscillator, so that the oscillator corrects the second clock signal according to the correction value.

10. The chip according to claim 9, wherein after the correction logic circuit reads the OTP memory, the correction logic circuit provides the correction value to the oscillator, so that the oscillator corrects the second clock signal according to the correction value.

11. The chip according to claim 1, wherein the correction logic circuit performs multiple times of the correction operations, and a frequency of the second clock signal sequentially corrected by the correction logic circuit is approximated to a frequency target successively, wherein the correction logic circuit performs the multiple times of the correction operations, and a plurality of count values obtained in the correction operations are approximated to the second count target value successively.

12. An automatic correction method for a clock signal, comprising:
providing a first clock signal through a transmission interface, wherein the first clock signal is a discontinuous clock signal;
generating a second clock signal by an oscillator;
performing a correction operation by a correction logic circuit to count the first clock signal to generate a first clock count value, and count the second clock signal to generate a second clock count value;
when the first clock count value is equal to a first count target value, stopping counting through the correction logic circuit;
calculating a correction value by the correction logic circuit according to the second clock count value and a second count target value;
outputting the correction value to the oscillator by the correction logic circuit; and
correcting a frequency of the second clock signal by the oscillator according to the correction value,
wherein calculating the correction value comprises:
subtracting the second count target value from the second clock count value by the correction logic circuit to obtain a first value, and dividing the first value by a multiple value and by an offset coefficient to obtain the correction value.

13. The automatic correction method according to claim 12, wherein correcting the frequency of the second clock signal comprises:
adding up the correction value and a first encode value corresponding to the second clock signal by the correction logic circuit to generate a second encode value, and
generating a new second clock signal by the oscillator according to the second encode value.

14. The automatic correction method according to claim 12, wherein the transmission interface is a serial peripheral interface (SPI), and the first clock signal is a SPI clock signal.

15. The automatic correction method according to claim 12, wherein the correction logic circuit counts the first clock signal and the second clock signal simultaneously.

16. The automatic correction method according to claim 12, further comprising:
storing the correction value in a one-time programmable (OTP) memory; and
wherein when a chip is started up next time, reading the OTP memory by the correction logic circuit and providing the correction value to the oscillator, so that the oscillator corrects the second clock signal according to the correction value.

17. The automatic correction method according to claim 16, wherein after the correction logic circuit reads the OTP memory, the correction logic circuit provides the correction value to the oscillator, so that the oscillator corrects the second clock signal according to the correction value.

18. The automatic correction method according to claim 12, wherein the correction logic circuit performs multiple times of the correction operations, and a plurality of count values obtained in the correction operations are approximated to the second count target value successively, wherein the correction logic circuit performs the multiple times of the correction operations, and the frequency of the second clock signal sequentially corrected by the correction logic circuit is approximated to a frequency target successively.

* * * * *